United States Patent [19]
Fujikura et al.

[11] Patent Number: 5,525,454
[45] Date of Patent: Jun. 11, 1996

[54] PHOTOSENSITIVE TRANSFER MATERIAL

[75] Inventors: Sadao Fujikura; Minoru Wada, both of Shizuoka, Japan

[73] Assignee: Fuji Photo Film Co., Ltd., Kanagawa, Japan

[21] Appl. No.: 271,952

[22] Filed: Jul. 8, 1994

[30] Foreign Application Priority Data

Jul. 8, 1993 [JP] Japan .................................. 5-169218

[51] Int. Cl.$^6$ .................................................. G03C 1/805
[52] U.S. Cl. ........................ 430/263; 430/257; 430/262; 430/281.1; 430/293
[58] Field of Search ...................... 430/271, 262, 430/263, 293, 292, 7, 257, 281

[56] References Cited

U.S. PATENT DOCUMENTS

| | | | |
|---|---|---|---|
| 3,884,693 | 5/1975 | Bauer et al. | 430/263 |
| 5,004,668 | 4/1991 | Namiki et al. | 430/263 |
| 5,158,857 | 10/1992 | Shinozaki et al. | 430/263 |
| 5,292,613 | 3/1994 | Sato et al. | 430/262 |
| 5,294,516 | 3/1994 | Sato et al. | 430/262 |
| 5,409,800 | 4/1995 | Sato et al. | 430/263 |

*Primary Examiner*—John S. Y. Chu
*Attorney, Agent, or Firm*—Sughrue, Mion, Zinn, Macpeak & Seas

[57] ABSTRACT

A photosensitive transfer material is disclosed including a temporary substrate having provided thereon an alkali-soluble thermoplastic resin layer, an intermediate layer, and a photosensitive resin layer in this order, the transfer material having an interlaminar adhesion which is lowest between the thermoplastic resin layer and the temporary substrate, wherein the alkali-soluble thermoplastic resin layer contains (A) an alkali-soluble thermoplastic resin having a weight average molecular weight of from 50,000 to 500,000 and a glass transition temperature of from 0° to 140° C. and (B) an alkali-soluble thermoplastic resin layer having a weight average molecular weight of from 3,000 to 30,000 and a glass transition temperature of from 30° to 170° C. at an (A)/(B) weight ratio of from 5/95 to 95/5. The transfer material can be transferred to a permanent substrate at a high speed without entrapping air bubbles due to unevenness on the permanent substrate. The temporary substrate can easily be stripped off after transfer. Exposure in air is possible. The thermoplastic resin layer is rapidly removed with an alkali aqueous solution.

18 Claims, No Drawings

PHOTOSENSITIVE TRANSFER MATERIAL

FIELD OF THE INVENTION

This invention relates to a photosensitive transfer material suitable for dry transfer onto a substrate with an uneven surface and to an image formation method using the same. The photosensitive transfer material and image formation method according to the present invention are suited for the production of color filters to be used in liquid crystal displays or for the production of printed circuit boards.

BACKGROUND OF THE INVENTION

Image forming materials for transferring a photosensitive resin layer onto a substrate are known from, for example, JP-B-56-40824 (the term "JP-B" as used herein means an "examined published Japanese patent application"). Image forming materials of this type are used in the manufacture of printed circuit boards, intaglio or relief printing plates, name plates, multicolor printing proofs, offset printing plates, screen printing stencils, etc. These transfer materials are basically composed of a temporary substrate, a parting layer, and a photopolymerizable layer. Image formation using the transfer material is carried out by adhering the photopolymerizable layer to a permanent substrate, stripping the temporary substrate off the transfer material, exposing the photopolymerizable layer to light through the parting layer, and developing the exposed photopolymerizable layer to form an image on the permanent substrate. The parting layer serves as an oxygen barrier in favor of exposure in air. Having a very small thickness of from about 0.5 to 5 μm, the parting layer does not adversely affect the resolving power.

However, where a permanent substrate to which a photopolymerizable layer is to be transferred has unevenness, air bubbles are apt to be entrapped between the substrate and a very thin photopolymerizable layer, resulting in insufficient transfer. For example, this is observed in the case of formation of a multicolor image as in the preparation of a color filter, in which the transfer of pixels of a first color is followed by the transfer of a photosensitive resin layer of a second color, and in the case where a dry resist layer is transferred to the copper surface of a copper-clad laminate having fine scratches or marks resulting from polishing as in the preparation of printed circuit boards.

JP-A-2-213849 (the term "JP-A" as used herein means an "unexamined published Japanese patent application") discloses a transfer material having an intermediate layer of a polyvinyl alcohol derivative, etc. between a temporary substrate and a photosensitive resin layer. Provision of the intermediate layer aims at improvements in releasability of the temporary substrate and dissolving characteristics, with no consideration being given to transfer properties in the case where the transfer material is transferred to a permanent substrate having unevenness.

JP-A-63-309946 points out the occurrence of transfer failure due to insufficient adhesion of a transfer layer to a permanent substrate where the substrate has fine irregularities on its surface or where the substrate and/or the transfer layer have thereon fine particles such as dust. In order to prevent such transfer failure, the publication teaches the use of a compressive temporary substrate. This means is certainly effective but is still insufficient for preventing entrapment of air where a non-tacky photosensitive resin layer is transferred at room temperature to a substrate whose surface roughness is equal to the thickness of the photosensitive resin layer.

JP-A-5-72724 discloses a transfer method using a photosensitive transfer material comprising a temporary substrate, particularly a gelatin-coated plastic film, having thereon a thermoplastic resin layer, a parting layer, and a photosensitive resin layer in this order, in which the photosensitive resin layer is adhered to a permanent substrate, and the temporary substrate and the thermoplastic resin layer are then simultaneously stripped off to leave the photosensitive resin layer on the permanent substrate. According to this method, however, it is not always easy to control the release between the thermoplastic resin layer and the parting layer, which is a disadvantage in automating the release operation.

U.S. Pat. No. 5,292,613 discloses a photosensitive transfer material comprising a temporary substrate having thereon an alkali-soluble thermoplastic resin layer, an intermediate layer, and a photosensitive resin layer in this order. The transfer properties of this transfer material are still insufficient for achieving a high speed and a high yield in transfer, even at a high temperature, onto a permanent substrate whose surface roughness is equal to the thickness of the photosensitive resin layer. In addition, removal of the alkali-soluble thermoplastic resin layer with an alkali aqueous solution takes time, making it difficult to increase the speed of the whole line.

U.S. Pat. No. 5,292,613 discloses a photosensitive transfer material comprising a temporary substrate having thereon an alkali-soluble thermoplastic resin layer, an intermediate layer, and a photosensitive resin layer in this order. If the alkali-soluble thermoplastic resin layer comprises a soft resin or contains a large quantity of a plasticizer in an attempt to increase the transfer speed, fine wrinkles develop on the intermediate layer, formed on an alkali-soluble thermoplastic resin layer formed on a temporary substrate, and remain there as surface unevenness, called reticulation. Reticulation has been a hindrance to obtaining a smooth coating surface of a photosensitive resin layer formed thereon. It has therefore been difficult to achieve a high speed in transfer while preventing reticulation.

SUMMARY OF THE INVENTION

An object of the present invention is to provide a photosensitive transfer material in which the photosensitive resin layer can be transferred to a permanent substrate at a high speed without involving entrapment of air due to unevenness of the permanent substrate surface (scratches or differences in level based on previously existing pixels, etc.), the temporary substrate can be stripped off satisfactorily, exposure to light can be conducted in air, and the alkali-soluble thermoplastic resin layer can rapidly be removed with an alkali aqueous solution.

Another object of the present invention is to provide a method for image formation using the above-mentioned photosensitive transfer material.

A further object of the present invention is to provide a photosensitive transfer material in which the photosensitive resin layer suffers from no surface unevenness due to reticulation which would occur on an intermediate layer when the intermediate layer is provided on an alkali-soluble thermoplastic resin layer and to provide a method for image formation using such a photosensitive transfer material.

A yet further object of the present invention is to provide a photosensitive transfer material in which the alkali-soluble thermoplastic resin layer has a reduced thickness so as to minimize the amount of the alkali-soluble thermoplastic resin dissolved into a developing solution thereby reducing fatigue of the developing solution.

A still further object of the present invention is to provide an image formation method which prevents fatigue of a developing solution or unevenness of development.

The above and other objects of the present invention are accomplished by a photosensitive transfer material comprising a temporary substrate having provided thereon an alkali-soluble thermoplastic resin layer, an intermediate layer, and a photosensitive resin layer in this order, the transfer material having an interlaminar adhesion which is lowest between the thermoplastic resin layer and the temporary substrate, wherein the alkali-soluble thermoplastic resin layer contains at least (A) an alkali-soluble thermoplastic resin having a weight average molecular weight (hereinafter abbreviated as Mw) of from 50,000 to 500,000 and a glass transition temperature (hereinafter referred to as Tg) of from 0° to 140° C. (hereinafter referred to as resin A) and (B) an alkali-soluble thermoplastic resin layer having an Mw of from 3,000 to 30,000 and a Tg of from 30° to 170° C. (hereinafter referred to as resin B) at an (A)/(B) weight ratio of from 5/95 to 95/5; and by an image formation method using such a photosensitive transfer material which comprises the steps of: adhering the photosensitive resin layer to a permanent substrate at least under heat and, if desired, under pressure; stripping the temporary substrate off the thermoplastic resin layer; imagewise exposing the photosensitive resin layer through the thermoplastic resin layer and the intermediate layer; and developing the photosensitive resin layer to form an image on the permanent substrate.

DETAILED DESCRIPTION OF THE INVENTION

The temporary substrate which can be used in the present invention should desirably be satisfactorily releasable from a thermoplastic resin layer, chemically and thermally stable, and flexible. Suitable temporary substrates include a thin sheet of Teflon, polyethylene terephthalate, polycarbonate, polyethylene, polypropylene, etc. and laminates thereof.

The thickness of the temporary substrate suitably ranges from 5 to 300 μm, and preferably from 20 to 150 μm.

In some cases, depending on transfer conditions, a thermoplastic resin is pushed out during transfer to contaminate the permanent substrate. This problem can be solved by using thermoplastic resins soluble in an alkali aqueous solution. Having alkali solubility, the thermoplastic resin contaminating the permanent substrate can easily be removed afterward with an alkali aqueous solution.

The alkali aqueous solution for removal of the thermoplastic resin may or may not be the same as an alkali developing solution to be used for development of a photosensitive resin. The terminology "alkali aqueous solution" as used herein means a dilute aqueous solution of an alkaline substance which may contain a small amount an organic solvent miscible with water. Suitable alkaline substances include alkali metal hydroxides (e.g., sodium hydroxide and potassium hydroxide), alkali metal carbonates (e.g., sodium carbonate and potassium carbonate), alkali metal hydrogencarbonates (e.g., sodium hydrogencarbonate and potassium hydrogencarbonate), alkali metal silicates (e.g., sodium silicate and potassium silicate), alkali metal metasilicates (e.g., sodium metasilicate and potassium metasilicate), triethanolamine, diethanolamine, monoethanolamine, morpholine, tetraalkylammonium hydroxides (e.g., tetramethylammonium hydroxide), and sodium tertiary phosphate. The alkali aqueous solution preferably contains the alkaline substance in a concentration of from 0.01 to 30% by weight and has a pH ranging from 8 to 14.

The water-miscible organic solvents which may be added to the alkali aqueous solution include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidone. The concentration of the water-miscible organic solvent is desirably from 0.1 to 30% by weight. The alkali aqueous solution may further contain a conventional surface active agent in a concentration preferably of from 0.01 to 10% by weight.

Resins A and B constituting the thermoplastic resin layer include a saponification product of an ethylene-acrylic ester copolymer, a saponification product of a styrene-(meth)acrylic ester copolymer, a styrene-(meth)acrylic acid-(meth)acrylic ester terpolymer, a saponification product of a vinyltoluene-(meth)acrylic ester copolymer, poly-(meth)acrylates, a saponification product of a (meth)acrylic ester copolymer (e.g., a butyl (meth)acrylate-vinyl acetate copolymer), and the alkali-soluble organic high polymers described in *Plastic Seino Binran,* edited by Japan Plastics Industry Federation and All Japan Federation of Plastics Molding Industry, published by Kogyo Chosakai (25.10.1968).

Resin A can be at least one resin selected from the above-mentioned alkali-soluble thermoplastic resins so as to have an Mw of from 50,000 to 500,000 and a Tg of from 0° to 140° C. Resin A preferably has an Mw of from 60,000 to 200,000 and a Tg of from 30° to 110° C. Specific examples of resin A are described in JP-B-54-34327, JP-B-55-38961, JP-B-58-12577, JP-B-54-25957, JP-A-61-134756, JP-B-59-44615, JP-A-54-92723, JP-A-54-99418, JP-A-54-137085, JP-A-57-20732, JP-A-58-93046, JP-A-59-97135, JP-A-60-159743, German Patent Application (OLS) 3504254, JP-A-60-247638, JP-A-60-159743, German Patent Application (OLS) 3504254, JP-A-60-247638, JP-A-60-208748, JP-A-60-214354, JP-A-60-230135, JP-A-60-258539, JP-A-61-169829, JP-A-61-213213, JP-A-63-147159, JP-A-63-213837, JP-A-63-266448, JP-A-64-55551, JP-A-64-55550, JP-A-2-191955, JP-A-2-199403, JP-A-2-199404, JP-A-2-208602, and JP-A-5-241340. Particularly preferred as resin A is a methacrylic acid/2-ethylhexyl acrylate/benzyl methacrylate/methyl methacrylate copolymer disclosed in JP-A-63-147159.

Resin B which also constitutes the thermoplastic resin layer can be at least one resin selected from the above-mentioned alkali-soluble thermoplastic resins so as to have an Mw of from 3,000 to 30,000 and a Tg of from 30° to 170° C. Resin B preferably has an Mw of from 4,000 to 20,000 and a Tg of from 60° to 140° C. Examples of suitable resins B are given in the above-listed publications. Particularly preferred as resin B is a styrene/(meth)acrylic acid copolymer disclosed in JP-B-55-38961 and JP-A-5-241340.

If resin A has an Mw of less than 50,000 or a Tg of less than 0° C., reticulation occurs, or the thermoplastic resin is pushed out during transfer to contaminate a permanent substrate. If the Mw exceeds 500,000 or if the Tg exceeds 140° C., air bubbles are entrapped among pixels at the time of transfer, or the removability of the thermoplastic resin with an alkali aqueous solution is seriously reduced.

If resin B has an Mw of less than 3,000 or a Tg of less than 30° C. reticulation occurs, or the thermoplastic resin is pushed out during transfer to contaminate a permanent substrate. If the Mw exceeds 30,000 or if the Tg exceeds 170° C., air bubbles are entrapped among pixels at the time of transfer, or the removability of the thermoplastic resin with an alkali aqueous solution is seriously reduced.

The weight ratio of resin A to resin B ((A)/(B) weight ratio) is 5/95 to 95/5, preferably from 10/90 to 90/10, and more preferably from 20/80 to 80/20. If the amount of resin A in the A/B resin mixture exceeds 95%, air bubbles tend to be entrapped among pixels at the time of transfer. If the amount of resin A in the A/B resin mixture is less than 5%, the thermoplastic resin tend to be pushed out on transfer, or the thermoplastic resin layer becomes brittle and tends to produce fine dust on cutting.

For the purpose of controlling adhesion to a temporary substrate and/or transfer properties, the Tg of the thermoplastic resin layer can be adjusted minutely by adding other various polymers, plasticizers, supercooling substances, adhesion improving agents, surface active agents, parting agents, and so on to these organic high polymers.

Examples of suitable plasticizers are polypropylene glycol, polyethylene glycol, dioctyl phthalate, diheptyl phthalate, dibutyl phthalate, tricresyl phosphate, cresyl diphenyl phosphate, biphenyl diphenyl phosphate, polyethylene glycol mono(meth)acrylate, polyethylene glycol di(meth)acrylate, polypropylene glycol mono(meth)acrylate, polypropylene glycol di(meth)acrylate, an adduct of an epoxy resin and polyethylene glycol mono(meth)acrylate, an adduct of an organic diisocynate and polyethylene glycol mono(meth)acrylate, an adduct of an organic diisocyanate and polypropylene glycol mono(meth)acrylate, and a condensate of bisphenol A and polyethylene glycol mono(meth)acrylate.

The plasticizer is preferably added in an amount up to 200%, and more preferably in an amount of from 20 to 100%, by weight based on the sum of resins A and B.

The thermoplastic resin layer preferably has a thickness of not less than 6 μm. If the thickness of this layer is less than 6 μm, the layer fails to completely absorb an unevenness of 1 μm or more of a permanent substrate. The upper limit of the thickness of the thermoplastic resin layer is desirably about 100 μm, and preferably about 50 μm, from the standpoint of removability with an alkali aqueous solution and production suitability.

The intermediate layer is not particularly limited and may be prepared from conventional materials which are dispersible or soluble in water or an alkali aqueous solution and exhibit low oxygen permeability. Such materials for the intermediate layer include those described in JP-A-46-2121 and JP-B-56-40824, such as polyvinyl ether/maleic anhydride polymers, water-soluble salts of a carboxyalkyl cellulose, water-soluble cellulose ethers, water-soluble salts of a carboxyalkylated starch, polyvinyl alcohol, polyvinyl pyrrolidone, various polyacrylamide resins, various water-soluble polyamide resins, water-soluble salts of polyacrylic acid, gelatin, ethylene oxide polymers, water-soluble salts of various types of starch and analogues thereof, styrene-maleic acid copolymers, maleate resins, and combinations of two or more thereof.

Of these materials, a combination of polyvinyl alcohol and polyvinyl pyrrolidone is preferred. The polyvinyl alcohol to be used preferably has a degree of saponification of at least 80%. The proportion of polyvinyl pyrrolidone in the combination preferably ranges from 1 to 75% by weight, more preferably from 1 to 60% by weight, and most preferably from 10 to 50% by weight, based on the total solids content of the intermediate layer. If it is less than 1% by weight, sufficient adhesion to a photosensitive resin layer is hardly obtained. If it exceeds 75% by weight, the oxygen barrier properties would be reduced.

The intermediate layer is very thin, desirably having a thickness of from about 0.1 to about 5 μm, and preferably from 0.5 to 2 μm. If the thickness is less than about 0.1 μm, oxygen permeability is too high. If it exceeds about 5 μm, development or removal of the intermediate layer would take a lot of time.

It is preferable that the photosensitive resin layer be softened or becomes tacky at a temperature not higher than 150° C. and be thermoplastic. Most of the photosensitive resin layers obtained from known photopolymerizable compositions have the above-mentioned characteristics. Some of the known layers may further be modified by addition of a thermoplastic resin binder or a compatible plasticizer.

Any of known photosensitive resins, such as those described in JP-A-3-282404, may be used as a material of the photosensitive resin layer of the present invention. Suitable photosensitive resins include photosensitive compositions comprising a negative type diazo resin and a binder, photopolymerizable compositions, photosensitive resin compositions comprising an azide compound and a binder, and cinnamic acid-type photosensitive resin compositions, with photopolymerizable compositions being particularly preferred. The photopolymerizable compositions basically comprise a photopolymerization initiator, a photopolymerizable monomer(s), and a binder.

While known photosensitive resins include those developable with an alkali aqueous developing solution and those developable with an organic solvent, the former are preferred from the standpoint of prevention of environmental pollution and safety of the working environment.

The thickness of the photosensitive resin layer is generally from 0.5 to 5 μm and preferably from 1 to 3 μm.

An alkali aqueous solution which can be used as an alkali developing solution is a dilute aqueous solution of an alkaline substance which may contain a small amount of an organic solvent miscible with water.

Suitable alkaline substances include alkali metal hydroxides (e.g., sodium hydroxide and potassium hydroxide), alkali metal carbonates (e.g., sodium carbonate and potassium carbonate), alkali metal hydrogencarbonates (e.g., sodium hydrogencarbonate and potassium hydrogencarbonate), alkali metal silicates (e.g., sodium silicate and potassium silicate), alkali metal metasilicates (e.g., sodium metasilicate and potassium metasilicate), triethanolamine, diethanolamine, monoethanolamine, morpholine, tetraalkylammonium hydroxides (e.g., tetramethylammonium hydroxide), and sodium tertiary phosphate. The alkali aqueous solution preferably contains the alkaline substance in a concentration of from 0.01 to 30% by weight and has a pH ranging from 8 to 14.

The water-miscible organic solvents which may be present in the alkali aqueous solution include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidone. The concentration of the water-miscible organic solvent is desirably from 0.1 to 30% by weight. The alkali aqueous solution may further contain a conventional surface active agent in a concentration preferably of from 0.01 to 10% by weight.

The developing solution may be used either as a bath or as a spray. Removal of the uncured area of the photosensitive resin layer with the developing solution, i.e., development, can be effected while rubbing with a rotating brush, a wet sponge, etc. The developing solution is preferably used at a temperature of from room temperature to 40° C., more preferably from 15° to 40° C., and particularly preferably from 20° to 35° C. If necessary, the development step may be followed by a step of washing with water.

Removal of the thermoplastic resin layer, the intermediate layer, and the uncured area of the photosensitive resin layer may be carried out all at once with the same developing solution under the same development conditions. However, in order to reduce development unevenness or fatigue of the developing solution, removal of these three layers is preferably carried out in two divided stages in which the thermoplastic resin layer and the intermediate layer are first removed (first stage) and the photosensitive resin layer is then developed (second stage). In this case, while the remover to be used for the first stage can be selected from the above-mentioned solvent type or aqueous developing solutions, it is preferable to conduct the first stage under milder conditions than those for the second stage development so as to minimize the influences on the photosensitive resin layer. This can be achieved by choosing a developing solution whose dissolving rate for the thermoplastic resin layer and the intermediate layer is different from that for the photosensitive resin layer and by changing the processing conditions, such as the liquid temperature, spray pressure, and force of rubbing. For example, when the developing solution is chosen as a remover in the first stage such that the minimum time required for development of the photosensitive resin layer is at least twice the minimum time required for removal of the thermoplastic resin layer and the intermediate layer, only the thermoplastic resin layer and the intermediate layer are removed without substantial development of the photosensitive resin layer. Thereafter, the photosensitive resin layer is developed with a developing solution selected therefor. In this case, the developing solution for the photosensitive resin layer is prevented from being fatigued with the removal of the thermoplastic resin layer and the intermediate layer. Further, since development of the photosensitive resin layer can be conducted with neither thermoplastic resin layer nor intermediate layer thereon, the photosensitive resin layer does not undergo unevenness of development which may arise from uneven removal of the thermoplastic resin layer, and, as a result, a uniformly developed image can be obtained. The thermoplastic resin layer and the intermediate layer may be removed with a bath or spray of water or the above-mentioned developing solution while, if desired, rubbing with a rotating brush or a wet sponge.

If desired, the photosensitive resin layer may contain dyes or pigments. All the pigments must be uniformly dispersed in the photosensitive resin layer preferably to a particle size of not greater than 5 μm, and particularly not greater than 1 μm. In the production of color filters, pigments having a particle size of not greater than 0.5 μm are preferred.

Specific examples of suitable dyes or pigments are Victoria Pure Blue BO (C.I. 42595), Auramine (C.I. 41000), Fat Black HB (C.I. 26150), Monolite Yellow GT (C.I. Pigment Yellow 12), Permanent Yellow GR (C.I. Pigment Yellow 17), Permanent Yellow HR (C.I. Pigment Yellow 83), Permanent Carmine FBB (C.I. Pigment Red 146), C.I. Pigment Violet 19, Permanent Ruby FBH (C.I. Pigment Red 11), C.I. Pigment Red 81, Monastral Fast Blue (C.I. Pigment Blue 15), Monolite Fast Black B (C.I. Pigment Black 1), and carbon. Pigments suitable for the production of color filters include C.I. Pigment Red 97, C.I. Pigment Red 122, C.I. Pigment Red 149, C.I. Pigment Red 168, C.I. Pigment Red 177, C.I. Pigment Red 180, C.I. Pigment Red 192, C.I. Pigment Red 215, C.I. Pigment Green 7, C.I. Pigment Green 36, C.I. Pigment Blue 15:1, C.I. Pigment Blue 15:4, C.I. Pigment Blue 15:6, C.I. Pigment Blue 22, C.I. Pigment Blue 60, and C.I. Pigment Blue 64.

It is recommended to provide a thin protective sheet on the photosensitive resin layer for protection against contamination or damage during storage. The protective sheet may be made of the same or similar materials as those used as a temporary substrate but must have easy release from the photosensitive resin layer. Suitable protective sheets include silicone paper, a polyolefin sheet, and a polytetrafluoroethylene sheet. The protective sheet preferably has a thickness of from about 5 to 100 μm. An especially preferred protective sheet is a polyethylene or polypropylene film having a thickness of from 10 to 30 μm.

The photosensitive transfer material according to the present invention can be prepared by applying a coating solution for a thermoplastic resin layer on a temporary substrate, followed by drying (e.g., at 50° to 130° C. for 1 to 5 minutes) to form a thermoplastic resin layer, applying thereto a coating solution for an intermediate layer containing a solvent incapable of dissolving the thermoplastic resin layer, followed by drying to form an intermediate layer, and applying thereto a coating composition for a photosensitive resin layer containing a solvent incapable of dissolving the intermediate layer, followed by drying to form a photosensitive resin layer.

The transfer material may also be prepared advantageously by adhering a protective sheet having formed thereon a photosensitive resin layer and a temporary substrate having formed thereon a thermoplastic resin layer and an intermediate layer in this order, with the photosensitive resin layer and the intermediate layer facing each other; or by adhering a temporary substrate having formed thereon a thermoplastic resin layer and a protective sheet having formed thereon a photosensitive resin layer and an intermediate layer in this order, with the thermoplastic resin layer and the intermediate layer facing each other.

When the photosensitive resin layer of a photosensitive transfer material is adhered to a permanent substrate and the temporary substrate is then stripped off, cases are sometimes met in which the film and a human body are statically charged to give an irritating electric shock to the worker. Further, the static electrification tends to cause the film to attract dust, which may produce an unexposed area in the subsequent exposure step to cause pinholes.

In order to prevent the static electrification, it is preferable to reduce the surface resistivity of the temporary substrate to $10^{13}$ Ω or less, and particularly $10^{12}$ Ω or less, by providing an electrically conductive layer on at least one side of the temporary substrate or by rendering the temporary substrate itself electrically conductive.

The temporary substrate itself can be rendered electrically conductive by incorporating therein a conductive substance, such as fine particles of a metal oxide or an antistatic agent. Suitable metal oxides to be incorporated include a crystalline metal oxide selected from zinc oxide, titanium oxide, tin oxide, aluminum oxide, indium oxide, silicon oxide, magnesium oxide, barium oxide, and molybdenum oxide and/or a mixed oxide thereof. Suitable antistatic agents to be incorporated include anionic surface active agents, such as alkyl phosphate compounds (e.g., "Electrostripper A", produced by Kao Soap Co., Ltd., and "Elenon No. 19", produced by Dai-ichi Kogyo Seiyaku Co., Ltd.); amphoteric surface active agents, such as betaine compounds (e.g., "Amogen K", produced by Dai-ichi Kogyo Seiyaku Co., Ltd.); and nonionic surface active agents, such as polyoxyethylene fatty acid esters (e.g., "Nissan Nonion L", produced by Nippon Oils & Fats Co., Ltd.) and polyoxyethylene alkyl ethers (e.g., "Emulgen 106, 120, 147, 420, 220, 905, and 910", produced by Kao Soap Co., Ltd., and "Nissan Nonion E", produced by Nippon Oils & Fats Co., Ltd.). In addition, other nonionic surface active agents, such as polyoxyethylene alkylphenol ethers, polyhydric alcohol fatty acid esters, polyoxyethylene sorbitan fatty acid esters, and polyoxyethylene alkylamine compounds, may also be employed.

The electrically conductive layer which can be formed on the temporary substrate is properly selected from known conductive layers. Among them, a conductive layer containing fine particles of a crystalline metal oxide selected from ZnO, $TiO_2$, $SnO_2$, $Al_2O_3$, $In_2O_3$, $SiO_2$, MgO, BaO, and $MoO_3$ and/or a mixed oxide thereof is preferred for its conductivity unaffected by humidity. The fine particles of the crystalline metal oxide or mixed metal oxide preferably have a volume resistivity of not higher than $10^7$ Ω·cm, and particularly not higher than $10^5$ Ω·cm, and a particle size of from 0.01 to 0.7 μm, and particularly from 0.02 to 0.5 μm.

The details for preparation of the conductive fine particles of the crystalline metal oxide or mixed metal oxide are described in JP-A-56-143430. In brief, the conductive fine particles may be obtained by a process comprising preparing metal oxide fine particles by calcination and then subjecting the particles to a heat treatment in the presence of a different atom for improving conductivity, a process comprising preparing metal oxide fine particles by calcination in the presence of a different atom for improving conductivity, or a process comprising preparing metal oxide fine particles by calcination in an atmosphere having a diminished oxygen concentration to introduce an oxygen defect. The different atom to be used is, for example, Al or In for ZnO; Nb or Ta for $TiO_2$, or Sb, Nb or a halogen atom for $SnO_2$. The different atom is preferably added in an amount of from 0.01 to 30 mol %, and particularly from 0.1 to 10 mol %.

These conductive fine particles are usually used in an amount of from 0.05 to 20 $g/m^2$, and preferably from 0.1 to 10 $g/m^2$.

The conductive layer may contain, as a binder, gelatin, a cellulose ester (e.g., cellulose nitrate, cellulose triacetate, cellulose diacetate, cellulose acetate butyrate, and cellulose acetate propionate), a homo- or copolymer comprising vinylidene chloride, vinyl chloride, styrene, acrylonitrile, vinyl acetate, a $C_{1-4}$ alkyl acrylate, vinylpyrrolidone, etc., a soluble polyester resin, a polycarbonate resin, a soluble polyamide resin, and so on. In dispersing the conductive fine particles in the binder, a dispersant, such as a titanium type dispersant or a silane type dispersant, may be added. A binder crosslinking agent may also be used.

Suitable titanium type dispersants include titanate coupling agents described in U.S. Pat. Nos. 4,069,192 and 4,080,353, and "Plane Act" produced by Ajinomoto Co., Inc. Suitable silane type dispersants include vinyltrichlorosilane, vinyltriethoxysilane, vinyltris(β-methoxyethoxy)silane, γ-glycidoxypropyltrimethoxysilane, and γ-methacryloxypropyltrimethoxysilane. These silane type dispersants are commercially available as silane coupling agents from, e.g., Shin-Etsu Chemical Co., Ltd.

Usable binder crosslinking agents include epoxy type crosslinking agents, isocyanate type crosslinking agents, and aziridine type crosslinking agents.

A preferred conductive layer is formed by applying a dispersion of the conductive fine particles in a binder on a temporary substrate or by forming a prime coat on a temporary substrate and then adhering conductive fine particles thereto.

Where the conductive layer is provided on the temporary substrate on the side opposite to the photosensitive resin layer, it is preferable to further provide a hydrophobic polymer layer on the conductive layer to ensure scratch resistance. The hydrophobic polymer layer can be formed by applying a solution of the polymer in an organic solvent or an aqueous latex of the polymer to a dry weight of desirably from about 0.05 $g/m^2$ to about 1 $g/m^2$.

Examples of suitable hydrophobic polymers include cellulose esters (e.g., nitrocellulose and cellulose acetate), vinyl polymers comprising vinyl chloride, vinylidene chloride, vinyl acrylate, etc., organic solvent-soluble polyamide resins, and polyester resins. The hydrophobic polymer layer may contain slip agents for imparting slip properties, such as organic carboxylic acid amides described in JP-A-55-79435. The hydrophobic polymer layer may also contain a matting agent. Such a hydrophobic polymer layer, if provided, exerts substantially no influence upon the effect of the conductive layer. The prime coat, provided if desired, includes vinylidene chloride copolymers described in JP-A-51-135526 and U.S. Pat. Nos. 3,143,421, 3,586,508, 2,698,235, and 3,567,452; diolefin copolymers comprising butadiene, etc. described in JP-A-51-114120 and U.S. Pat. No. 3,615,556; glycidyl (meth)acrylate-containing copolymers described in JP-A-51-58469; polyamide-epichlorohydrin resins described in JP-A-48-24923; and maleic anhydride-containing copolymers described in JP-A-50-39536.

In addition to the above-described conductive layers, those shown in JP-A-56-82504, JP-A-56-143443, JP-A-57-104931, JP-A-57-118242, JP-A-58-62647, and JP-A-60-258541 are also useful.

In a particularly preferred embodiment of the conductive layer formation, a conductive layer is formed by co-extruding a resin material, which may be the same or different from that of a temporary substrate, containing conductive fine particles together with the film of a temporary substrate. In this case, a conductive layer with excellent adhesion and scratch resistance can easily be obtained, and there is no need to provide the above-mentioned hydrophobic polymer layer or a prime coat.

Where a conductive layer is formed by coating, coating may be carried out by any of known techniques, such as roller coating, air knife coating, gravure coating, bar coating, curtain coating, and the like.

For the purpose of improving slip properties or preventing blocking between the photosensitive resin surface layer and the back of the temporary substrate, it is effective to coat the back of the temporary substrate with a slip coating containing known fine particles or a release coating containing a silicone compound.

Where a conductive layer is formed on the side having no thermoplastic resin layer, the adhesion between the thermoplastic resin layer and the substrate may be increased by subjecting the substrate to a surface treatment, such as a glow discharge treatment, a corona discharge treatment, and an ultraviolet radiation treatment, and/or by coating the substrate with a prime coat, such as a phenolic substance, a polyvinylidene chloride resin, a styrene-butadiene rubber, or gelatin.

Where the thermoplastic resin is an alkali-soluble resin, a polyethylene terephthalate film which has been subjected to a corona discharge treatment and then coated with gelatin exhibits particularly excellent adhesion to the alkali-soluble thermoplastic resin layer. In this case, the gelatin layer preferably has a thickness of from 0.01 to 2 μm.

Image formation by the use of the photosensitive transfer material according to the present invention can be carried out as follows.

The photosensitive resin layer from which a protective sheet, if any, has been removed is adhered onto a permanent substrate under heat or heat-pressure by means of a known laminator or a known vacuum laminator. The heating temperature is generally from 100° to 160° C., and preferably from 120° to 150° C. The pressure, if applied, is generally from 2 to 30 kg/cm², and preferably from 5 to 20 kg/cm². An autocut laminator may be used for increasing productivity. Then, the temporary substrate is stripped off, and the photosensitive resin layer transferred to the permanent substrate is exposed to light through a prescribed mask, the thermoplastic resin layer and the intermediate layer, followed by development. Development can be performed in a known manner, e.g., by soaking in a solvent type or aqueous developing solution, especially an alkali aqueous solution, or by spraying a solvent type or aqueous developing solution, especially an alkali aqueous solution, while, if desired, rubbing with a brush, etc. or applying ultrasonic waves.

A multicolor image can be formed by repeating the above-mentioned procedure using a plurality of photosensitive transfer materials differing in the color of the photosensitive resin layer.

The photosensitive transfer material of the present invention is advantageously used chiefly for producing printed circuit boards and forming multicolor images, especially a color filter of a liquid crystal display and a protective layer of the color filter.

In the production of printed circuit boards, a known copper-clad laminate is used as a permanent substrate. In the production of color filters, a known glass plate or a soda glass plate having formed thereon a silicon oxide film is used as a permanent substrate.

The present invention will now be illustrated in greater detail with reference to Examples, but it should be understood that the present invention be not deemed to be limited thereto. All the parts, percents, ratios and the like are by weight unless otherwise indicated.

EXAMPLE 1

A coating composition having formulation C1 shown below was applied to a 50 μm thick polyethylene terephthalate (PET) film as a temporary substrate and dried to form a 20 μm thick thermoplastic resin layer.

| Formulation C1: | |
| --- | --- |
| Methyl methacrylate/2-ethylhexyl acrylate/benzyl-methacrylate/methacrylic acid (55/10/5/30 by mole) copolymer (Mw: 100,000; Tg: ca. 70° C.) | 7 parts |
| Styrene/acrylic acid (65/35 by mole) copolymer (Mw: 10,000; Tg: ca. 100° C.) | 7 parts |
| Dehydration condensation product between bisphenol A and 2 equivalents of octa-ethylene glycol monomethacrylate ("BPE-500" produced by Shin-Nakamura Kagaku K.K.) | 7 parts |
| Methyl ethyl ketone | 50 parts |

A coating composition having formulation P1 shown below was applied on the thermoplastic resin layer and dried to form a 1.6 μm thick intermediate layer.

| Formulation P1: | |
| --- | --- |
| Polyvinyl alcohol ("PVA 205" produced by Kuraray Co., Ltd.; degree of saponification: 80%) | 100 parts |
| Polyvinyl pyrrolidone ("PVP K-90" produced by GAF Corp.) | 50 parts |
| Distilled water | 4,000 parts |

A photosensitive coating composition having the formulation shown in Table 1 below was applied on the intermediate layer and dried to form a 2 μm thick photosensitive resin layer colored in red (R layer), blue (B layer), green (G layer) or black (K layer).

A 12 μm thick polypropylene protective sheet was then contact bonded on the photosensitive resin layer to obtain a red, blue, green or black photosensitive transfer material.

TABLE 1

| Formulation | R Layer (g) | B Layer (g) | G Layer (g) | K Layer (g) |
| --- | --- | --- | --- | --- |
| Benzyl methacrylate/ methacrylic acid (73/27 by mol) copolymer (viscosity: 0.12) | 60 | 60 | 60 | 60 |
| Pentaerythritol tetra-acrylate | 43.2 | 43.2 | 43.2 | 43.2 |
| Michler's ketone | 2.4 | 2.4 | 2.4 | 2.4 |
| 2-(o-Chlorophenyl)-4,5-diphenylimidazole dimer | 2.5 | 2.5 | 2.5 | 2.5 |
| Irgazine Red BPT (red) | 5.4 | — | — | — |
| Sudan Blue (blue) | — | 5.2 | — | — |
| Copper phthalo-cyanine (green) | — | — | 5.6 | — |
| Carbon black (black) | — | — | — | 5.6 |
| Methyl cellosolve acetate | 560 | 560 | 560 | 560 |
| Methyl ethyl ketone | 280 | 280 | 280 | 280 |

A color filter was produced by using the resulting 4 color photosensitive transfer materials as follows.

The red photosensitive transfer material from which the protective sheet had been removed was adhered to a 1.1 mm thick transparent glass substrate under heat (130° C.) and pressure (10 kg/cm²) at a speed of 0.7 m/min by means of a laminator ("VP-II" manufactured by Taisei Laminator K.K.), and the temporary substrate was stripped off the thermoplastic resin layer.

The photosensitive resin layer was exposed to light through a prescribed mask, and the thermoplastic resin layer and the intermediate layer were removed by dissolving with a 1% triethanolamine aqueous solution. The least amount of time required for completely removing these layers was 30 seconds. Then the remaining photosensitive resin layer was developed with a 1% sodium carbonate aqueous solution to remove the unnecessary part thereof to form a pattern of red pixels on the glass substrate.

The green photosensitive transfer material from which the protective sheet had been removed was adhered to the glass substrate having thereon the red pixels, stripped of the temporary substrate, exposed to light, and developed in the same manner as set forth above to form a pattern of green pixels.

A pattern of blue pixels and a pattern of black pixels were successively formed on the same substrate by using the blue photosensitive transfer material and the black photosensitive transfer material in this order in the same manner as described above to obtain a color filter on the transparent glass substrate.

In the above operation, the temporary substrate showed satisfactory release from the respective thermoplastic resin layer. In the transfer of the green, blue or black photosensitive resin layer, no air bubbles were entrapped around the previously formed pixels. The resulting color filter exhibited satisfactory adhesion to the glass substrate with no lack of pixels and was free from contamination.

COMPARATIVE EXAMPLE 1

A color filter was prepared in the same manner as in Example 1, except that formulation C1 was replaced with formulation C2 shown below.

| Formulation C2: | |
| --- | --- |
| Methyl methacrylate/2-ethylhexyl acrylate/ benzyl methacrylate/methacrylic acid (55/30/10/5 by mole) copolymer (Mw: 100,000; Tg: ca. 70° C.) | 15 parts |
| Dehydration condensation product between bisphenol A and 2 equivalents of octa- ethylene glycol monomethacrylate (BPE-500) | 7 parts |
| Methyl ethyl ketone | 50 parts |

In this case, air was entrapped between previously formed pixels and a successively transferred photosensitive resin layer. As a result, some pixels were missing, and the adhesion between the pixels and the substrate was insufficient. The least amount of time required for removal of the thermoplastic resin layer and the intermediate layer was as long as 60 seconds.

COMPARATIVE EXAMPLE 2

A color filter was prepared in the same manner as in Comparative Example 1, except that the speed of laminating was changed to 0.4 m/min and the laminating temperature was changed to 150° C.

In this case, entrapment of air bubbles was observed in some parts, and the uncured area of the color photosensitive resin layer was not completely removed from the glass substrate by the development. The remaining uncured layer could not be removed even by further subjecting the sample to development processing.

COMPARATIVE EXAMPLE 3

A color filter was prepared in the same manner as in Example 1, except that formulation C1 was replaced with formulation C3 shown below.

| Formulation C3: | |
| --- | --- |
| Methyl methacrylate/2-ethylhexyl acrylate/ benzyl methacrylate/methacrylic acid (55/30/10/5 by mole) copolymer (Mw: 100,000; Tg: ca. 70° C.) | 15 parts |
| Dehydration condensation product between bisphenol A and 2 equivalents of octa- ethylene glycol monomethacrylate (BPE-500) | 11 parts |
| Methyl ethyl ketone | 50 parts |

In this case, reticulation occurred on forming the intermediate layer on the thermoplastic resin layer. Air was entrapped between previously formed pixels and a successively transferred photosensitive resin layer. As a result, some pixels were missing, and the adhesion between the pixels and the substrate was insufficient due to the air bubbles.

COMPARATIVE EXAMPLE 4

A color filter was prepared in the same manner as in Example 1, except that formulation C1 was replaced with formulation C4 shown below.

| Formulation C4: | |
| --- | --- |
| Styrene/acrylic acid (65/35 by mole) copolymer (Mw: 10,000; Tg: ca. 100° C.) | 15 parts |
| Dehydration condensation product between bisphenol A and 2 equivalents of octa- ethylene glycol monomethacrylate (BPE-500) | 7 parts |
| Methyl ethyl ketone | 50 parts |

In this case, reticulation occurred on forming the intermediate layer on the thermoplastic resin layer. The thermoplastic resin was considerably pushed out on transfer to seriously contaminate the transparent glass substrate and the heated roller of the laminator.

EXAMPLE 2

A color filter was prepared in the same manner as in Example 1, except that formulation C1 was replaced with formulation C5 shown below.

| Formulation C5: | |
| --- | --- |
| Methyl methacrylate/2-ethylhexyl acrylate/ benzyl methacrylate/methacrylic acid (55/30/10/5 by mole) copolymer (Mw: 100,000; Tg: ca. 70° C.) | 7 parts |
| Methyl methacrylate/2-ethylhexyl acrylate/ benzyl methacrylate/methacrylic acid (55/30/10/5 by mole) copolymer (Mw: 10,000; Tg: ca. 70° C.) | 7 parts |
| Dehydration condensation product between bisphenol A and 2 equivalents of octa- ethylene glycol monomethacrylate (BPE-500) | 7 parts |
| Methyl ethyl ketone | 50 parts |

Similarly to Example 1, all the photosensitive transfer materials showed satisfactory results in terms of transfer properties with no entrapment of air bubbles, release of the temporary substrate from the thermoplastic resin layer, pixel retention in the resulting color filter, and adhesion to the glass substrate. Further, neither reticulation nor contamination with the thermoplastic resin was observed. The least amount of time required for removal of the thermoplastic resin layer and the intermediate layer was as short as 35 seconds.

EXAMPLE 3

The same 20 μm thick PET film having thereon a thermoplastic resin layer and an intermediate layer as prepared in Example 1 was coated with a photosensitive solution having the following formulation to a dry thickness of 20 μm.

| Formulation: | |
| --- | --- |
| Methyl methacrylate/2-ethylhexyl acrylate/benzyl methacrylate/methacrylic acid (55/30/10/5 by mole) copolymer (Mw: 100,000) | 35.0 parts |
| Dodecapropylene glycol diacrylate | 15.0 parts |
| Tetraethylene glycol dimethacrylate | 4.0 parts |
| p-Toluenesulfonamide | 1.0 part |
| 4,4-Bis(diethylamino)benzophenone | 0.15 part |
| Benzophenone | 2.5 parts |
| 2-(2'-Chlorophenyl)-4,5-diphenyl-imidazole dimer | 4.0 parts |
| Tribromomethylphenylsulfone | 0.30 part |
| Leuco Crystal Violet | 0.30 part |
| Malachite Green | 0.02 part |
| Methyl ethyl ketone | 70.0 parts |

The resulting transfer material was laminated on a copper-clad laminate (copper foil thickness: 35 μm; width: 5 cm), which was polished with a #800 buff and cleaned, at a temperature of 105° C. and a speed of 3 m/min. The PET substrate was stripped off, and the photosensitive resin layer was exposed to light from a 5 kw ultrahigh-pressure mercury lamp ("HMW-532D" manufactured by Oak & Co., Ltd.) at 50 mJ/cm$^2$ through a photomask having a fine pattern (line/space=100 μm/100 μm). Fifteen minutes after the exposure, the photosensitive resin layer was developed with a spray of a 1% sodium carbonate aqueous solution (30° C.) for 40 seconds and washed with water (20° C.) for 40 seconds. The copper-clad laminate having thereon the thus formed resist pattern was etched with a cupric chloride etchant at 45° C. for 2 minutes to remove the copper foil not covered with the resist. The resist layer was then removed with a 3% sodium hydroxide aqueous solution (50° C.). The resulting copper wiring suffered from no cutting or missing portions.

COMPARATIVE EXAMPLE 5

An etching resist was formed on a copper-clad laminate and etching of the copper foil was conducted in the same manner as in Example 3, except that the photosensitive resin layer used in Example 3 was formed directly on the PET film without forming a thermoplastic resin layer and an intermediate layer. The resulting copper wiring suffered from cutting and missing portions.

As described above, the photosensitive transfer material according to the present invention has a thermoplastic resin layer having improved transfer properties between layers to be transferred (a photosensitive resin layer and an intermediate layer) and a temporary substrate. Owing to this thermoplastic resin layer, transfer can be performed at a high speed without entrapping air bubbles even if a permanent substrate has unevenness on its surface or even when using a general laminator. Accordingly, the present invention makes it possible to form a monochromatic or multicolor pattern of high quality through simple operation.

The thermoplastic resin layer used in the present invention rapidly dissolves in an alkali aqueous solution, thereby contributing to an improvement in processing speed.

With no occurrence of reticulation, the photosensitive transfer material of the present invention can be produced in a stable manner.

While the invention has been described in detail and with reference to specific examples thereof, it will be apparent to one skilled in the art that various changes and modifications can be made therein without departing from the spirit and scope thereof.

What is claimed is:

1. A photosensitive transfer material comprising a temporary substrate having provided thereon an alkali-soluble thermoplastic resin layer, an intermediate layer, and a photosensitive resin layer in this order, said transfer material having an interlaminar adhesion which is lowest between said thermoplastic resin layer and said temporary substrate, wherein said alkali-soluble thermoplastic resin layer contains at least (A) an alkali-soluble thermoplastic resin having a weight average molecular weight of from 50,000 to 500,000 and a glass transition temperature of from 0° to 140° C. and (B) an alkali-soluble thermoplastic resin having a weight average molecular weight of from 3,000 to 30,000 and a glass transition temperature of from 30° to 170° C. at an (A)/(B) weight ratio of from 5/95 to 95/5.

2. A photosensitive transfer material as claimed in claim 1, wherein said resin (A) has a weight average molecular weight of from 60,000 to 200,000 and a glass transition temperature of from 30° to 110° C., and said resin (B) has a weight average molecular weight of from 4,000 to 20,000 and a glass transition temperature of from 60° to 140° C.

3. A photosensitive transfer material as claimed in claim 1, wherein said temporary substrate has a thickness of from 5 to 300 μm.

4. A photosensitive transfer material as claimed in claim 1, wherein said temporary substrate has a thickness of from 20 to 150 μm.

5. A photosensitive transfer material as claimed in claim 1, wherein said resin (A) is a methacrylic acid/2-ethylhexyl acrylate/benzyl methacrylate/methyl methacrylate copolymer.

6. A photosensitive transfer material as claimed in claim 1, wherein said resin (B) is a styrene/(meth)acrylic acid copolymer.

7. A photosensitive transfer material as claimed in claim 1, wherein said thermoplastic resin layer has a thickness of at least 6 μm.

8. A photosensitive transfer material as claimed in claim 1, wherein said thermoplastic resin layer has a thickness of at most about 100 μm.

9. A photosensitive transfer material as claimed in claim 1, wherein said thermoplastic resin layer has a thickness of at most about 50 μm.

10. A photosensitive transfer material as claimed in claim 1, wherein said intermediate layer is a combination of polyvinyl alcohol and polyvinyl pyrrolidone.

11. A photosensitive transfer material as claimed in claim 10, wherein said polyvinyl alcohol has a degree of saponification of at least 80%.

12. A photosensitive transfer material as claimed in claim 10, wherein said polyvinyl pyrrolidone is present in said combination in an amount of 1 to 75% by weight, based on total solids content of said intermediate layer.

13. A photosensitive transfer material as claimed in claim 10, wherein said polyvinyl pyrrolidone is present in said combination in an amount of 1 to 60% by weight, based on total solids content of said intermediate layer.

14. A photosensitive transfer material as claimed in claim 10, wherein said polyvinyl pyrrolidone is present in said combination in an amount of 10 to 50% by weight, based on total solids content of said intermediate layer.

15. A photosensitive transfer material as claimed in claim 1, wherein said intermediate layer has a thickness of from about 0.1 to about 5 μm.

16. A photosensitive transfer material as claimed in claim 1, wherein said intermediate layer has a thickness of from about 0.5 to about 2 μm.

17. A photosensitive transfer material as claimed in claim 1, wherein said photosensitive resin layer is obtained from a photopolymerizable composition.

18. A photosensitive transfer material as claimed in claim 1, wherein said photosensitive resin layer is developable with an alkali aqueous developing solution.

* * * * *